(12) United States Patent
Kim et al.

(10) Patent No.: US 10,879,294 B2
(45) Date of Patent: *Dec. 29, 2020

(54) IMAGE SENSOR PACKAGE HAVING MULTI-LEVEL STACK STRUCTURE

(71) Applicant: SAMSUNG ELECTRONICS CO., LTD., Suwon-si (KR)

(72) Inventors: Yong-hoon Kim, Suwon-si (KR); Ji-chul Kim, Seoul (KR); Seung-yong Cha, Hwaseong-si (KR); Jae-choon Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/702,756

(22) Filed: Dec. 4, 2019

(65) Prior Publication Data

US 2020/0135790 A1 Apr. 30, 2020

Related U.S. Application Data

(63) Continuation of application No. 15/797,375, filed on Oct. 30, 2017, now Pat. No. 10,541,263.

(30) Foreign Application Priority Data

Nov. 14, 2016 (KR) .................. 10-2016-0151302

(51) Int. Cl.
*H01L 27/146* (2006.01)
*H01L 21/56* (2006.01)
(Continued)

(52) U.S. Cl.
CPC ...... *H01L 27/14634* (2013.01); *H01L 21/565* (2013.01); *H01L 21/76898* (2013.01);
(Continued)

(58) Field of Classification Search
CPC ......... H01L 27/14634; H01L 27/14645; H01L 27/14636; H01L 23/481; H01L 27/146; H01L 25/117; H01L 2224/1302
See application file for complete search history.

(56) References Cited

U.S. PATENT DOCUMENTS 5,334,829 A 8/1994 Ueno et al.
7,480,006 B1 * 1/2009 Frank .................. H04N 17/002
250/239
(Continued)

FOREIGN PATENT DOCUMENTS

JP 2006-174224 A 6/2006
JP 2015-088660 A 5/2015
(Continued)

*Primary Examiner* — Nduka E Ojeh
(74) *Attorney, Agent, or Firm* — Lee IP Law, P.C.

(57) ABSTRACT

An image sensor package includes an image sensor chip, a logic chip, and a memory chip structure that are vertically stacked. The image sensor chip includes a pixel array and an interconnection structure that receives a power voltage, ground voltage, or signals. The logic chip processes pixel signals from the image sensor chip and receives the power voltage, ground voltage, or signals via the image sensor chip. The memory chip structure includes a memory chip, a molding portion surrounding the memory chip, and at least one through mold via contact vertically passing through the molding portion and connected to at least one of the logic or memory chip. The memory chip stores at least one of a pixel signal processed by the logic chip or a pixel signal from the image sensor chip and receives the power voltage, ground voltage, or signals via the image sensor chip and logic chip.

20 Claims, 14 Drawing Sheets

(51) Int. Cl.
  *H01L 21/768* (2006.01)
  *H01L 23/34* (2006.01)
  *H01L 23/48* (2006.01)
  *H04N 5/378* (2011.01)

(52) U.S. Cl.
  CPC ........ *H01L 23/345* (2013.01); *H01L 27/1469* (2013.01); *H01L 27/14618* (2013.01); *H01L 27/14636* (2013.01); *H01L 27/14645* (2013.01); *H04N 5/378* (2013.01); *H01L 23/481* (2013.01); *H01L 27/14621* (2013.01); *H01L 27/14627* (2013.01); *H01L 2224/18* (2013.01)

(56) References Cited

U.S. PATENT DOCUMENTS

| | | | |
|---|---|---|---|
| 7,821,554 | B2 | 10/2010 | Ma et al. |
| 8,946,610 | B2 | 3/2015 | Iwabuchi et al. |
| 8,970,023 | B2 | 3/2015 | Chou et al. |
| 9,136,143 | B2 | 9/2015 | Yu et al. |
| 9,398,237 | B2 | 7/2016 | Brady et al. |
| 2006/0267168 | A1 | 11/2006 | Misawa et al. |
| 2013/0277840 | A1* | 10/2013 | Yu ........................ H01L 23/3675 257/738 |
| 2015/0097258 | A1* | 4/2015 | Shigetoshi ........ H01L 21/76898 257/432 |
| 2015/0137346 | A1 | 5/2015 | Kwon et al. |
| 2015/0364453 | A1 | 12/2015 | Schunk |
| 2017/0033144 | A1* | 2/2017 | Takahashi ......... H01L 27/14636 |
| 2017/0150081 | A1* | 5/2017 | Stockmeier .......... H04N 5/3651 |
| 2018/0026067 | A1* | 1/2018 | Lee .................. H01L 27/14636 257/777 |
| 2018/0145104 | A1* | 5/2018 | Kim ................. H01L 27/14634 |
| 2019/0086800 | A1* | 3/2019 | Masuda .................. C08L 79/08 |

FOREIGN PATENT DOCUMENTS

| | | |
|---|---|---|
| KR | 10-0781494 B1 | 11/2007 |
| KR | 10-2013-0015680 A | 2/2013 |
| KR | 10-1362396 B1 | 2/2014 |

\* cited by examiner

IMAGE SENSOR PACKAGE HAVING MULTI-LEVEL STACK STRUCTURE

CROSS-REFERENCE TO RELATED APPLICATIONS

This is a continuation application based on pending application Ser. No. 15/797,375, filed Oct. 30, 2017, the entire contents of which is hereby incorporated by reference.

Korean Patent Application No. 10-2016-0151302, filed on Nov. 14, 2016, and entitled: "Image Sensor Package," is incorporated by reference herein in its entirety.

BACKGROUND

1. Field

One or more embodiments described herein relate to an image sensor package.

2. Description of the Related Art

Image sensors capture an image of an object and convert the image to electrical signals. Sensors of this type are in, for example, digital cameras, phone cameras, portable camcorders, and cameras used in vehicles, security equipment, robots, and other electronic devices and systems. Existing image sensors have various limitations, e.g., limitations caused by lengthened interconnection paths and limited interconnection space. These limitations adversely affect power integrity (PI) and other characteristics.

SUMMARY

In accordance with one or more embodiments, an image sensor package includes an image sensor chip mounted above a package substrate and including a pixel array and an interconnection structure, the image sensor chip to receive power voltage, ground voltage, or signals, a logic chip vertically overlapping the image sensor chip above the package substrate, the logic chip to process a pixel signal output by the image sensor chip and to receive the power voltage, the ground voltage, or the signals via the image sensor chip, and a memory chip structure vertically overlapping the image sensor chip and the logic chip above the package substrate, the memory chip structure including a memory chip, a molding portion surrounding the memory chip, and at least one through mold via (TMV) contact vertically passing through the molding portion and connected to at least one of the logic chip or the memory chip, wherein the memory chip structure is to store at least one of a pixel signal processed by the logic chip or a pixel signal output by the image sensor chip and to receive the power voltage, the ground voltage, or the signals via the image sensor chip and the logic chip.

In accordance with one or more other embodiments, an image sensor package includes an image sensor chip mounted above a package substrate and including a pixel array and an interconnection structure, a logic chip vertically overlapping the image sensor chip above the package substrate, the logic chip to process a pixel signal output by the image sensor chip, and a memory chip structure vertically overlapping the image sensor chip and the logic chip above the package substrate, the memory chip structure including a memory chip, a molding portion surrounding the memory chip, and at least one through molding via (TMV) contact vertically passing through the molding portion and connected to at least one of the logic chip or the memory chip, at least one redistribution structure in at least one of the logic chip or the memory chip structure, and a through silicon via (TSV) contact passing through the logic chip and having a first end connected to the interconnection structure of the image sensor chip and a second end connected to the at least one redistribution structure, wherein the memory chip is to store at least one of a pixel signal processed by the logic chip or a pixel signal output by the image sensor chip and wherein the memory chip is connected to the logic chip via the at least one redistribution structure and is connected to the image sensor chip via the at least one redistribution structure and the TSV contact.

In accordance with one or more other embodiments, an image sensor package includes a memory chip structure; an image sensor chip to receive one or more signals, a logic chip to process pixel signals from the image sensor chip, and wherein the memory chip structure, the image sensor chip, and the logic chip are vertically stacked, wherein the memory chip structure includes at least one through mold via (TMV) contact passing through a molding portion of the memory chip structure, and wherein the memory chip structure is to receive the one or more signals via the image sensor chip and the logic chip.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
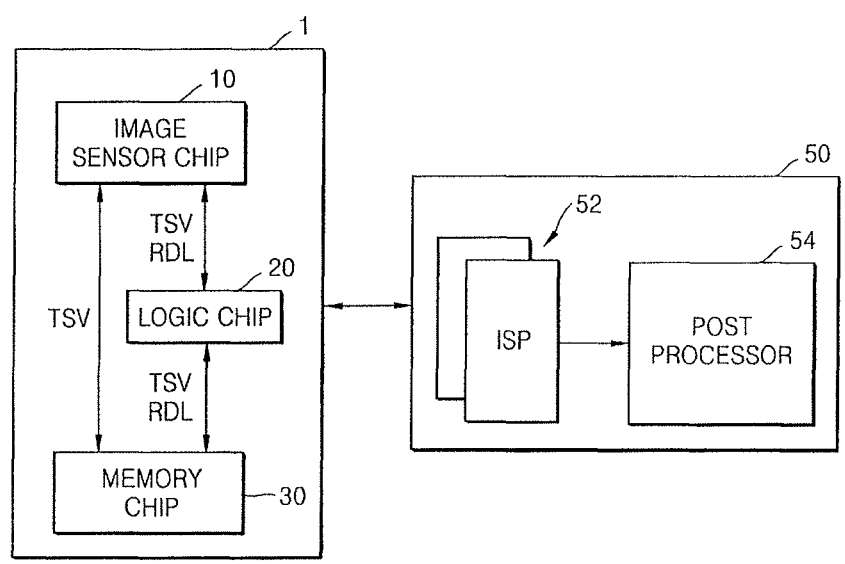
FIG. 1 illustrates an embodiment of an image sensor package.

FIG. 1 illustrates an embodiment of an image sensor package 1 which includes a CMOS image sensor (CIS). More specifically, the image sensor package 1 includes an image sensor chip 10, a logic chip 20, and a memory chip 30. In some embodiments, the image sensor chip 10, the logic chip 20, and the memory chip 30 may overlap each other on a package substrate in a direction perpendicular to a direction in which the package substrate extends. An example of the package substrate is a package substrate 410 illustrated in FIG. 8.

The image sensor package 1 may include at least one redistribution layer (RDL) in at least one of the logic chip 20 or the memory chip 30. In one or more embodiments, the at least one RDL may be at least one of a logic RDL in the logic chip 20 or a memory RDL in the memory chip 30.

The image sensor chip 10 includes a pixel array of unit pixels and an interconnection structure. The logic chip 20 vertically overlaps the image sensor chip 10 on the package substrate and performs operations which include processing pixel signals transmitted by the image sensor chip 10. The memory chip 30 vertically overlaps the image sensor chip 10 and the logic chip 20 on the package substrate, and performs operations which include storing at least one of a pixel signal processed by the logic chip 20 or a pixel signal transmitted by the image sensor chip 10. The memory chip 30 may be connected to the logic chip 20 via the at least one RDL. The memory chip 30 may be connected to the image sensor chip 10 through the at least one RDL and a through silicon via (TSV) passing through the logic chip 20.

The logic chip 20 may vertically overlap the memory chip 30 and the image sensor chip 10, and may be between the memory chip 30 and the image sensor chip 10.

In the image sensor package 1, a power voltage, a ground voltage, or signals (e.g., from an external source) may first be provided to the image sensor chip 10 and then may be provided to the memory chip 30 or the logic chip 20 through a TSV contact passing through the logic chip 20 and the at least one RDL.

In the image sensor package 1, a power voltage, a ground voltage, or signals for a package substrate (e.g., package substrate 410 in FIG. 8) may first be provided to the image sensor chip 10. Thereafter, the power voltage, ground voltage, or signals may be provided to the package substrate sequentially through the TSV contact passing through the logic chip 20 and at least one through molding via (TMV) contact passing through a molding portion surrounding the memory chip 30. In at least one embodiment, the power voltage, ground voltage, or signals may be provided through a plurality of TMV contacts 335 passing through a molding portion 302 such as in FIG. 5.

In one embodiment, a power voltage, a ground voltage, or signals may be first provided from an external source to an interconnection structure of the image sensor chip 10, and then from the image sensor chip 10 to an interior of the logic chip 20 and the memory chip 30. For example, the power voltage, ground voltage, or signals may be provided sequentially through a TSV contact connected to the interconnection structure of the image sensor chip 10 and then may pass through the logic chip 20 and the logic RDL on a surface of the logic chip 20 facing the memory chip 30, e.g., a backside of the logic chip 20.

In one embodiment, power voltage, ground voltage, or signals may be first provided to an interconnection structure of the image sensor chip 10 from an external source, and then to an interior of the logic chip 20 and the memory chip 30. The power voltage, ground voltage, an or signals may sequentially pass through a TSV contact connected to the interconnection structure of the image sensor chip 10 and through the logic chip 20 and the memory RDL, which are connected to the TSV contact and formed on a surface of the memory chip 30 facing the logic chip 20.

In one embodiment, a power voltage, a ground voltage, or signals may be first provided to an interconnection structure of the image sensor chip 10 from an external source, and then to an interior of the memory chip 30. The power voltage, ground voltage, or signal may sequentially pass through a TSV contact connected to the interconnection structure of the image sensor chip 10 and through the logic chip 20 and to the memory chip 30. The logic RDL may be formed on the backside surface of the logic chip 20 facing the memory chip 30. The memory RDL may be formed on a surface of the memory chip 30 facing the logic chip 20.

In one embodiment, a power voltage, a ground voltage, or signals may be first provided to an interconnection structure of the image sensor chip 10 from an external source and then to an interior of the memory chip 30. The power voltage, ground voltage, or signals may pass sequentially through a TSV contact, connected to the interconnection structure of the image sensor chip 10 and through the logic chip 20, and the memory RDL connected to the TSV contact and formed on a surface of the memory chip 30 facing the logic chip 20.

In one embodiment, the logic chip 20 may include a plurality of analog-digital converters (ADC). Image data may be transmitted from a pixel array block of the image sensor chip 10 to the analog-digital converters (ADC) of the logic chip 20. Data may be transmitted from the analog-digital converters (ADC) of the logic chip 20 to the memory chip 30 and may be written to a memory cell array of the memory chip 30, for example, a memory cell array (MCA) in FIG. 6.

Image signals processed by the logic chip 20 may be transmitted to an image processor 50. The image processor 50 may include at least one image signal processor (ISP) 52 and a post processor 54. The image processor 50 may output images captured by the image sensor chip 10 in a preview form on a display. When a capture command is input (e.g., from a user, system or device), the images captured by the image sensor chip 10 may be stored in the memory chip 30. The post processor 54 may perform various operations to generate digital image signals based on the images captured by the image sensor chip 10. For example, the post processor 54 may perform various post algorithms to provide high contrast images and/or high clarity images, to perform noise removal, or the like that, are not performed by the image signal processor 52. The output of the post processor 54 may be provided, for example, to a video codec processor. An image that has been processed by the video codec processor may be output on a display or stored in the memory chip 30.

Figure 2A:
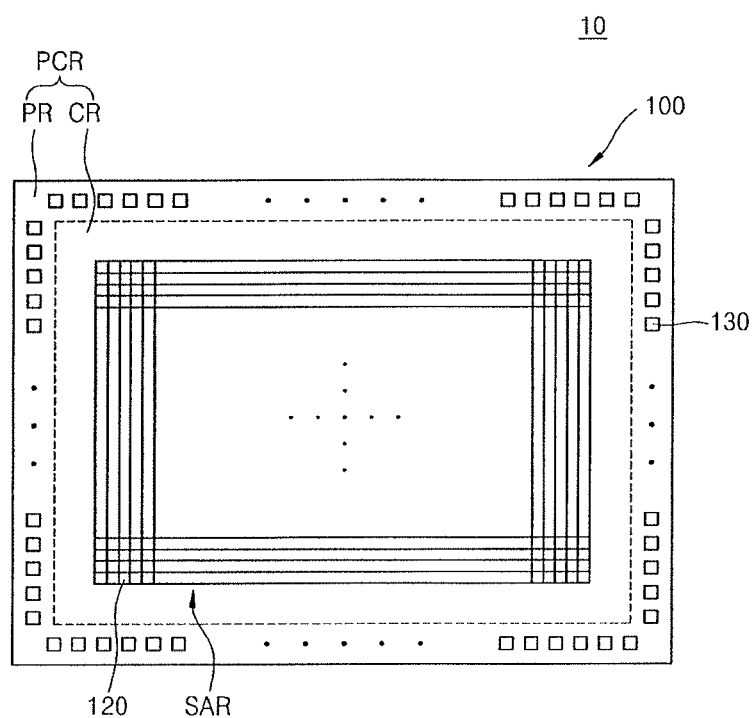
FIG. 2A illustrates an embodiment of an image sensor.
Figure 2B:
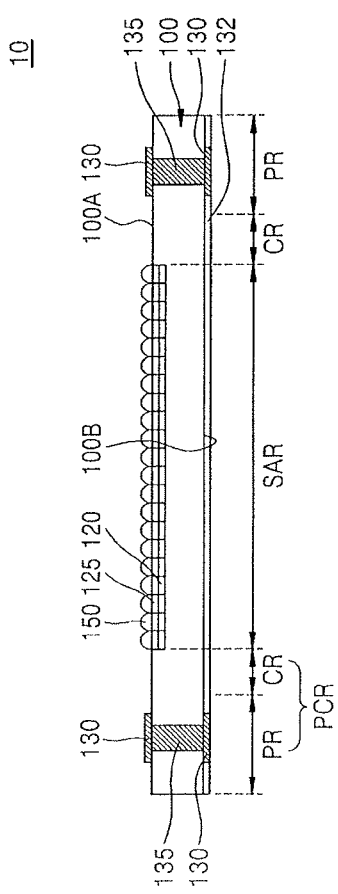
FIG. 2B illustrates an embodiment of a cross-sectional view of the image sensor.

FIG. 2A illustrates an embodiment of an image sensor 100 corresponding to the image sensor chip 10 that is to be included in an image sensor package. FIG. 2B illustrates an embodiment of a cross-sectional view of the image sensor 100.

Referring to FIGS. 2A and 2B, the image sensor 100 may include a sensor array region SAR, a circuit region CR, and a pad region PR. The image sensor 100 may be a CIS or a charge-coupled device (CCD). A pixel array including a plurality of unit pixels 120 may be arranged in a matrix on the sensor array region SAR. The circuit region CR may be along an edge of the sensor array region SAR. In some embodiments, the circuit region CR may be under the sensor array region SAR, while vertically overlapping the sensor array region SAR. The circuit region CR may include electronic devices that include a plurality of transistors. The circuit region CR may include an interconnection structure for providing a constant signal to the unit pixels 120 of the sensor array region SAR or for controlling output signals.

The unit pixels 120 may be, for example, a passive pixel sensor or an active pixel sensor. The unit pixels 120 may each include a photodiode that senses light, a transfer transistor that transfers charges generated by the photodiode, a floating diffusion region that stores transferred charges, a reset transistor that periodically resets the floating diffusion region, and a source follower that buffers signals corresponding to the charges filled in the floating diffusion region.

A plurality of conductive pads 130 may be arranged on the pad region PR to exchange electrical signals with an external device or a package base substrate. The pad region PR may surround the sensor array region SAR. The conductive pads 130 may be electrically connected to the unit pixels 120. The conductive pads 130 may include, for example, a metal, a metal nitride, or a combination thereof. The image sensor 100 may include a plurality of interconnection structures that electrically connect the conductive pads 130 to electronic devices of the circuit region CR and the unit pixels 120 of the sensor array region SAR. Each of the interconnection structures may include a metal, a metal nitride, or a combination thereof. The circuit region CR and the pad region PR may be included in a peripheral circuit region PCR of the image sensor 100.

Referring to FIG. 2B, the image sensor 100 includes a first surface 100A opposite to a second surface 100B. The unit pixels 120 may be on the first surface 100A of the image sensor 100. A plurality of color filters 125 may be on the unit pixels 120, with a plurality of microlenses 150 may be thereon.

The color filters 125 may include, for example, a red (R) filter, a blue (B) filter, and a green (G) filter. In one embodiment, the color filters 125 may include a cyan (C) filter, a yellow (Y) filter, and a magenta (M) filter. One of the R filter, the B filter, or the G filter or one of the C filter, the Y filter, or the M filter may be on each of the unit pixels 120 and may form a corresponding color filter from among the color filters 125. The unit pixels 120 may recognize a single color by sensing separated components of incident light.

The microlenses 150 may focus light entering the sensor array region SAR on the unit pixels 120. When each of the unit pixels 120 includes a photodiode, a respective microlens 150 may focus incident light of the sensor array region SAR on the photodiode of a corresponding unit pixel 120. Each of the microlenses 150 may include, for example, a TMR-based resin (a product of Tokyo Ohka Kogyo, Co.) or a MFR-based resin (a product of Japan Synthetic Rubber Corporation).

A plurality of TSV contacts 135 may pass through the image sensor 100. The TSV contacts 135 may electrically connect the conductive pads 130 on the first surface 100A of the image sensor 100 to the conductive pads 130 on the second surface 100B. Each of the TSV contacts 135 may include a metal plug and a conductive barrier film surrounding the metal plug. The metal plug may include Cu or W. For example, the metal plug may include Cu, CuSn, CuMg, CuNi, CuZn, CuPd, CuAu, CuRe, CuW, W, or W alloy. The metal plug may include, for example, at least one selected from Al, Au, Be, Bi, Co, Cu, Hf, In, Mn, Mo, Ni, Pb, Pd, Pt, Rh, Re, Ru, Ta, Te, Ti, W, Zn, or Zr. The conductive barrier film may include at least one of W, WN, WC, Ti, TiN, Ta, TaN, Ru, Co, Mn, WN, Ni, or NiB and may be a single layer or a multi-layer.

Each of the conductive barrier film and the metal plug may be formed, for example, by physical vapor deposition (PVD) or chemical vapor deposition (CVD). The TSV contacts 135 may be surrounded by a spacer insulating layer, for example, a spacer insulating layer 136 as in FIG. 4A. The spacer insulating layer 136 may prevent direct contact between electronic devices of the image sensor 100 and the TSV contacts 135.

A protection layer 132 may be on the second surface 100B of the image sensor 100. The protection layer 132 may have an opening exposing the conductive pads 13 and may include an oxide film, a nitride film, or a combination thereof.

The TSV contacts 135 in FIG. 2B may pass through the image sensor 100 and electrically connect the conductive pads 130 on the first surface 100A of the image sensor 100 to the conductive pads 130 on the second surface 100B of the image sensor 100. In another embodiment, the image sensor 100 may include at least one TSV contact having at least one of a via-first structure, a via-middle structure, or a via-last structure.

Figure 3:
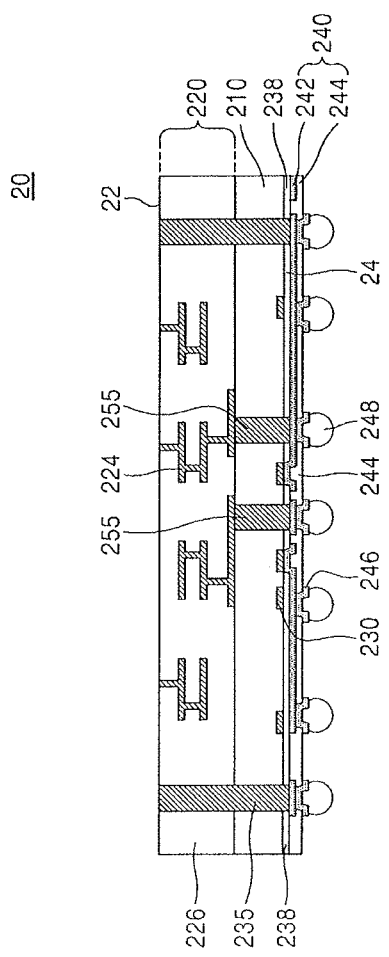
FIG. 3 illustrates an embodiment of a logic chip.

FIG. 3 illustrates a cross-sectional view of an embodiment of the logic chip 20 that corresponds to an image sensor chip for an image sensor package. The logic chip 20 may include an interconnection structure 220 on a logic substrate 210. The logic substrate 210 may include a semiconductor or a compound semiconductor. For example, the logic substrate 210 may include Si, Ge, silicon carbide (SiC), gallium arsenide (GaAs), indium arsenide (InAs), or indium phosphide (InP). The logic substrate 210 may include a conductive region, for example, an impurity-doped well or an impurity-doped structure. In some embodiments, the logic substrate 210 may include one of various device isolation structures, e.g., a shallow trench isolation (STI) structure.

The interconnection structure 220 may include a plurality of interconnection layers 224 having a multi-layer interconnection structure and an interlayer insulating film 226 that insulates the interconnection layers 224 from each other. The interconnection layers 224 in the interconnection structure 220 may form various logic circuits including but not limited to analog intellectual property (IP), such as a processor IP, an analog-to-digital converter (ADC), a digital-to-analog converter (DAC), or a phase-locked loop (PLL). Each of the interconnection layers 224 may include, for example, Cu, Al, or W. The interlayer insulating film 226 may include a silicon oxide film, a silicon nitride film, or a combination thereof.

The logic chip 20 has a first surface 22 on the side of the interconnection structure 220 and a second surface 24 on the side of the logic substrate 210 opposite to the first surface 22. In the logic chip 20, a plurality of first TSV contacts 235 may pass through the logic substrate 210 and the interconnection structure 220. The structure of the first TSV contacts 235 may be substantially the same as the TSV contacts 135 in FIG. 2B.

An insulating layer 238 and a logic redistribution structure 240 may be formed on the second surface 24 of the logic chip 20. The logic redistribution structure 240 may include a plurality of logic redistribution lines 242 and a redistribution insulating layer 244 covering the logic redistribution lines 242. The logic redistribution lines 242 may be connected to the interconnection structure 220 in the logic chip 20. In some embodiments, the logic redistribution lines 242 may be connected to a conductive pad 230 exposed by the second surface 24 of the logic chip 20, e.g., the backside of the logic substrate 210.

In one embodiment, the logic redistribution structure 240 may have a multi-layer structure. In this case, the logic redistribution structure 240 may include at least one redistribution via to connect different levels of the logic redistribution lines 242 to each other. Each of the logic redistribution lines 242 and the at least one redistribution via may include a metal, a metal nitride, or a combination thereof. For example, each of the logic redistribution lines 242 may include W, Cu, Zr, Ti, Ta, Al, Ru, Pd, Pt, Co, Ni, a nitride of the foregoing elements, or a combination thereof.

In one embodiment, each of the insulating layer 238 and the redistribution insulating layer 244 may include a passivation material, for example, polyimide. In one embodiment, each of the insulating layer 238 and the redistribution insulating layer 244 may include benzocyclobutenes (BCB), polybenzeneoxazole, polyimide, epoxy, silicon oxide, silicon nitride, or a combination thereof. However, a material for forming the insulating layer 238 and the redistribution insulating layer 244 is not limited thereto.

A first end of each of the first TSV contacts 235 may be exposed by the first surface 22 of the logic chip 20. A second end of each of the first TSV contacts 235, opposite to the first end, may be connected to the logic redistribution lines 242 of the logic redistribution structure 240.

Each of the first TSV contacts 235 may be connected to one of a plurality of contact terminals 248 via the logic redistribution structure 240 and an under bump metallization (UBM) layer. The contact terminals 248 in FIG. 3 have, for example, a solder ball shape. In one embodiment, each of the contact terminals 248 may be a solder bump. To prevent oxidation of the contact terminals 248, the contact terminals 248 may have a surface treated by organic coating or metal plating. The organic coating may be an organic solder preservation (OSP) coating. The metal plating may be Au, Ni, Pb, or Ag plating.

A plurality of second TSV contacts 255 may pass through the logic substrate 210 in a portion of the logic substrate 210, for example, substantially at the center thereof. The structure of the second TSV contacts 255 may be substantially the same as the TSV contacts 135 in FIG. 2B. A first end of each of the second TSV contacts 255 may be connected to the interconnection layers 224 in the interconnection structure 220. A second end of each of the second TSV contacts 255, opposite to the first end, may be connected to the logic redistribution lines 242 of the logic redistribution structure 240.

In an image sensor package according to present embodiment, the image sensor chip 10 may be mounted on the logic chip 20 in such a way that the image sensor chip 10 faces the first surface 22 of the logic chip 20.

Figure 4A:
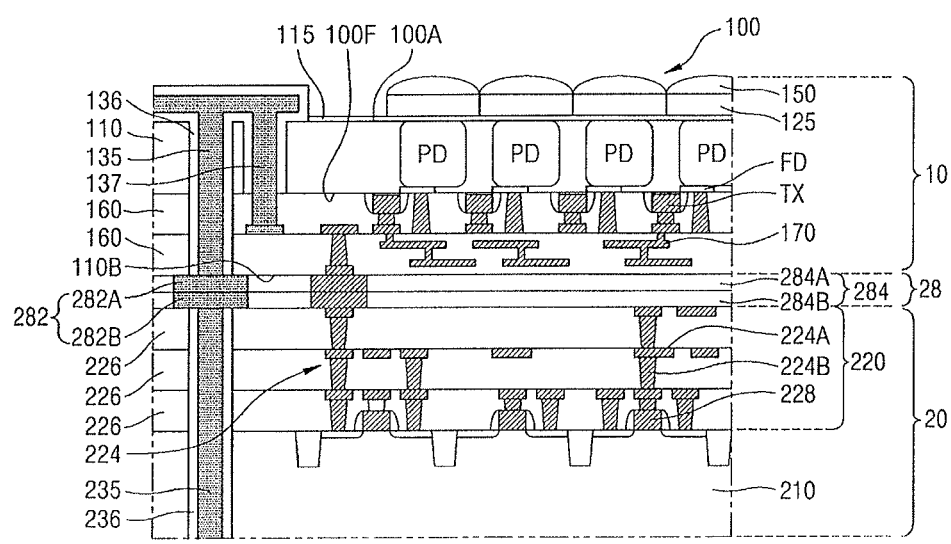
FIG. 4A illustrates an embodiment of an image sensor chip and a logic chip for an image sensor package.

FIG. 4A illustrates a cross-sectional view of an embodiment of an assembled structure of the image sensor chip 10 and the logic chip 20 for an image sensor package. Referring to FIG. 4A, some example elements of the image sensor chip 10 and some example elements of the logic chip 20, as in FIGS. 2A and 2B, are enlarged for illustrative purpose.

Referring to FIG. 4A, the image sensor 100 includes a sensor substrate 110. The structure of sensor substrate 110 may be the same as logic substrate 210 in FIG. 3. Each of a plurality of unit pixels in the image sensor 100 may include a photodiode PD as a photosensitive device, a transfer transistor TX as a readout circuit, a reset transistor RX, a drive transistor DX, and a selection transistor SX.

The photodiode PD may receive external light (for example, visible light or infrared light) and may generate photo charges based on the external light. The photo charges generated by the photodiode PD may be transferred to a floating diffusion region FD via a transfer transistor TX. When the transfer transistor TX is turned on, the photo charges from the photodiode PD may be transferred to the floating diffusion region FD via the transfer transistor TX. The image sensor 100 may be a backside illuminated image sensor (BIS) that generates image data based on incident light entering through the first surface 100A of the image sensor 100 corresponding to the backside of the sensor substrate 110.

In the image sensor 100, a plurality of gate structures for transmitting and amplifying electric signals (for example, photo charges) corresponding to incident light may be on a front surface 110F of the sensor substrate 110. In one embodiment, the color filters 125 for providing incident light to the photodiode PD and the microlenses 150 may be on the first surface 100A of the image sensor 100.

The photodiode PD may be formed within the sensor substrate 110 and generate photo charges corresponding to the incident light. The photodiode PD may generate an electron-hole pair corresponding to the incident light. The photodiode PD may separately collect electrons or holes. The photodiode PD may have a structure doped with an impurity different from an impurity doped into the sensor substrate 110. The transfer transistor TX may transfer the photo charges generated by the photodiode PD to the floating diffusion region FD in the sensor substrate 110. The floating diffusion region FD may receive photo charges via the transfer transistor TX. Image data of an image sensor may be generated based on the charge amount of the photo charges transferred to the floating diffusion region FD.

A reset gate of the image sensor 100 may receive a reset signal. When the reset signal is activated, charges accumulated in the floating diffusion region FD may be discharged, thereby allowing the floating diffusion region FD to be reset.

The color filters 125 may be arranged on the first surface 100A of the sensor substrate 110. The locations of the color filters 125 may respectively correspond to the photodiodes PD.

The locations of the microlenses 150 may respectively correspond to the photodiodes PD on the color filters 125. The microlenses 150 may control the pathway of incident light to focus the entering incident light on the photodiode PD.

A reflection prevention layer 115 may be between the sensor substrate 110 and the color filters 125. The reflection prevention layer 115 may prevent incident light from being reflected by the first surface 100A of the image sensor 100. The reflection prevention layer 115 may be formed by alternately stacking materials having different refractive indices several times.

An interlayer insulating film 160 may cover a plurality of gate structures and be on the front surface 100F of the sensor substrate 110. The interlayer insulating film 160 may have a multi-layer structure. The interlayer insulating film 160 may include an oxide. The interlayer insulating film 160 may insulate a plurality of interconnection structures 170 from each other. The interconnection structures 170 may be electrically connected to gate structures. The interconnection structures 170 may include metal, for example, Cu or W. The TSV contacts 135 may pass through the image sensor chip 10 and may be electrically connected to the interconnection structures 170.

Referring to FIG. 4A, the TSV contacts 135 may be connected to other TSV contacts 137 that are to be electrically connected to the interconnection structures 170. The TSV contacts 135 may be surrounded by the spacer insulating layer 136. The spacer insulating layer 136 may prevent electronic devices of the image sensor 100 from having a direct contact with the TSV contacts 135. The spacer insulating layer 136 may include an oxide film, a nitride film, a carbide layer, a polymer, or a combination thereof.

The logic chip 20 may include the interconnection structure 220 on the logic substrate 210. The interconnection structure 220 may include a plurality of logic gate structures 228, an interlayer insulating film 226 covering the logic gate structures 228 on the logic substrate 210, and the interconnection layers 224 insulated from each other by the interlayer insulating film 226. The interlayer insulating film 226 may have a multi-layer structure. The interconnection layers 224 may each include a plurality of interconnection lines 224A extending in parallel to the logic substrate 210 and a contact plug 224B connecting some of the interconnection lines 224A.

The first TSV contact 235 passing through the logic substrate 210 and the interconnection structure 220 may be surrounded by the spacer insulating layer 236. The spacer insulating layer 236 may prevent electronic devices of the logic chip 20 from having a direct contact with the first TSV contact 235. The spacer insulating layer 236 may include an oxide film, a nitride film, a carbide layer, a polymer, or a combination thereof.

An insertion layer 28 may be between the image sensor chip 10 and the logic chip 20, so that the image sensor chip 10 is electrically connected to the logic chip 20 through the insertion layer 28. The insertion layer 28 may include a connection portion 282 electrically connecting the image sensor chip 10 to the logic chip 20 and an insulating film 284. The connection portion 282 may include metal, for example, Cu or W. The connection portion 282 may pass through the insulating film 284. The connection portion 282 may include a first connection portion 282A and a second connection portion 282B. The insulating film 284 may include a first insulating film 284A surrounding the first connection portion 282A and a second insulating film 284B surrounding the second connection portion 282B. In some embodiments, the conductive pads 130 in FIG. 2B may be part of the connection portion 282 in FIG. 4A. The protection layer 132 in FIG. 2B may be part of the insulating film 284 in FIG. 4A.

Figure 4B:
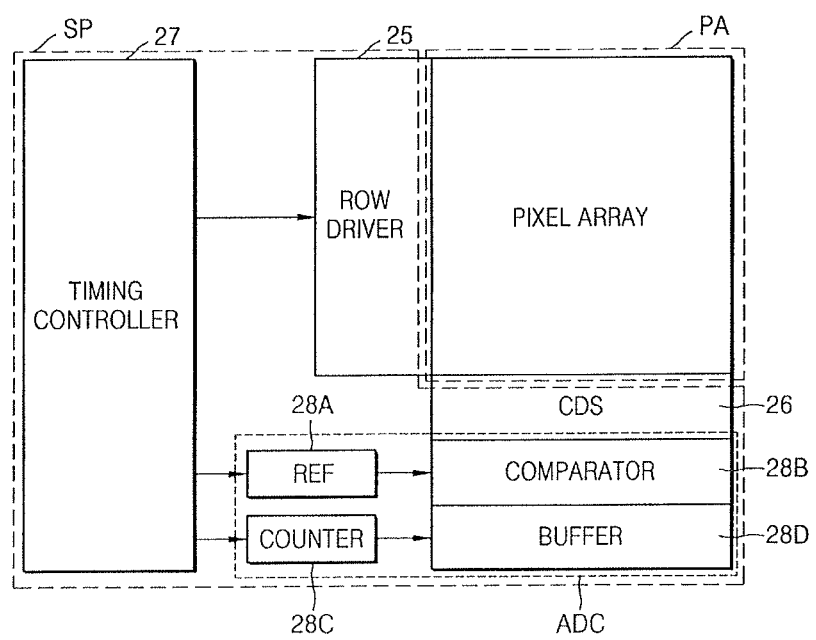
FIG. 4B illustrates an embodiment including a pixel array of the image sensor chip and a signal processor of the logic chip.

FIG. 4B illustrates an example operation of an example pixel array PA of the image sensor chip 10 and an embodiment of a signal processor SP of the logic chip 20 in the assembled structure of the image sensor chip 10 and the logic chip 20.

Referring to FIGS. 4A and 4B, the pixel array PA may include the unit pixels 120 on the sensor array region SAR (e.g., see FIG. 2A) of the image sensor chip 10.

The signal processor SP may provide the image sensor chip 10 with various driving signals to drive the pixel array PA. Electrical signals, obtained by converting incident light in the pixel array PA of the image sensor chip 10, may be provided to the signal processor SP of the logic chip 20.

The signal processor SP may process electrical signals transferred by the pixel array PA of the image sensor chip 10 to generate image data. The signal processor SP may include a row driver 25, a correlated double sampler (CDS) 26, an analog-digital converter ADC, and a timing controller 27.

The row driver 25 may be connected to every row of the pixel array PA and may generate driving signals to drive the row. For example, the row driver 25 may drive the unit pixels in the pixel array PA in a row unit.

The correlated double sampler 26 may obtain a difference between a reference voltage showing a reset state of the unit pixel using a capacitor, a switch, or the like, to perform correlated double sampling and output an analog sampling signal corresponding to an effective signal component. The correlated double sampler 26 includes a plurality of correlated double sampler circuits respectively connected to column lines of a pixel array PA and may output an analog sampling signal corresponding to the effective signal component in every column.

The analog-digital converter ADC may convert an analog image signal corresponding to the effective signal component to a digital image signal. The analog-digital converter ADC may include a reference signal generator REF 28A, a comparator 28B, a counter 28C, and a buffer 28D. The reference signal generator 28A may generate a reference signal (e.g., a ramp signal having a certain slope) and provide the ramp signal as a reference signal of the comparator. The comparator 28B compares an analog sampling signal output by the correlated double sampler 26 in each column with a ramp signal generated by a reference signal generator. Comparison signals having a transition point that varies depending on an effective signal component may then be output.

The counter 28C may perform a counting operation to generate a counting signal and may provide the counting signal to a buffer. The buffer 28D includes a plurality of latch circuits respectively connected to the column lines. A counting signal output by the counter based on a transition of each comparison signal is latched in each column. The latched counting signal may be output as image data.

The timing controller 27 may control operation timing of the row driver 25, the correlated double sampler 26, and the analog-digital converter ADC. The timing controller 27 may provide the row driver 25, the correlated double sampler 26, and the analog-digital converter ADC with a timing signal and a control signal.

Figure 5:
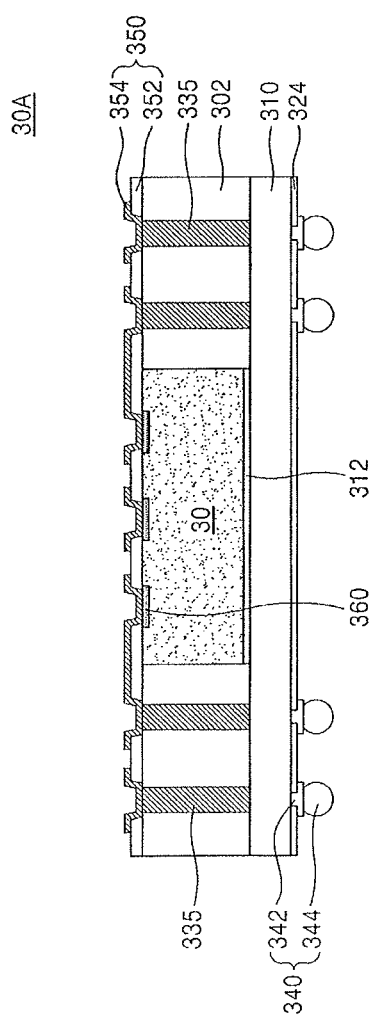
FIG. 5 illustrates an embodiment of a memory chip structure for an image sensor package.

FIG. 5 illustrates a cross-sectional view for explaining an example structure of a memory chip structure 30A including a memory chip 30 for an image sensor package.

Referring to FIG. 5, the memory chip 30 of the memory chip structure 30A may be on a lower structure 310 by a chip-on-wafer (COW) coupling method in which a chip is mounted on a wafer. The memory chip 30 may be one of a plurality of dies, obtained by dividing a wafer with memory devices thereon after performing a passivation process and a sawing process thereon. The memory chip 30 may be, for example, dynamic random access memory (DRAM), static random access memory (SRAM), phase-change random access memory (PRAM), magnetoresistive random access memory (MRAM), ferroelectric random access memory (FeRAM), resistive random access memory (RRAM), a flash memory, or electrically erasable programmable read-only memory (EEPROM).

The memory chip 30 on the lower structure 310 may be sealed by a molding portion 302. The molding portion 302 may cover a side wall of the memory chip 30, surrounding the memory chip 30. In some embodiments, the memory chip 30 may be attached on the lower structure 310 by a die adhesive film 312. The lower structure 310 may include a multi-layer interconnection structure and an insulating layer insulating the multi-layer interconnection structure. In some embodiments, the lower structure 310 may be skipped.

The memory chip 30 may include a plurality of chip pads 360. The chip pads 360 may include a conductive layer exposed outside the memory chip 30. Through the chip pads 360, electric signals may be input or output from the outside to the inside of the memory chip 30 or from the inside to the outside of the memory chip 30. The number and shape of the chip pads 360 may depend on the kind or characteristics of unit devices constituting the memory chip 30.

The molding portion 302 may include, for example, an epoxy resin. The size and intervals of the chip pads 360 to input or output electric signals to or from the memory chip 30 may be relatively small. To apply the memory chip 30 to a package substrate, a module, or a system board, the chip pads 360 may be arranged according to a joint electron device engineering council (JEDEC) standard.

The TMV contacts 335 may vertically extend to pass through the molding portion 302. The TMV contacts 335 may be connected to a multi-layer interconnection pattern in the lower structure 310. The TMV contacts 335 may be connected to an external device through a plurality of connection elements 340. Each of the connection elements 340 may include a bump pad 342 and a bump 344.

The bump pad 342 may be on the passivation layer 324 covering the lower structure 310, passing through the passivation layer 324, and may be connected to a multi-layer interconnection structure in the lower structure 310. The bump pad 342 may be connected to one of the TMV contacts 335 through the multi-layer interconnection structure in the lower structure 310. A UBM layer may be on the bump pad 342. The bump pad 342 may include, for example, Al or Cu. The bump 344 may be formed on the bump pad 342. The bump 344 may include, for example, Cu, Al, Au, a solder.

A memory redistribution structure 350 may be on a surface of the memory chip 30 facing the logic chip 20 above the memory chip 30 and the molding portion 302. The memory redistribution structure 350 may extend between the memory chip 30 and the logic chip 20 and between the molding portion 302 and the logic chip 20. The memory redistribution structure 350 may include an insulating layer 352 covering the memory chip 30 and the molding portion 302 and a plurality of memory redistribution lines 354 on the insulating layer 352, and are selectively connected to an interconnection structure within the memory chip 30 and the TMV contacts 335.

The chip pads 360 of the memory chip 30 may be connected to the memory redistribution lines 354. Input/output (I/O) terminal interconnections of the memory chip 30 may be connected to the memory redistribution lines 354 via the chip pads 360.

In an image sensor package according to present embodiment, the memory chip 30 in FIG. 5 and the logic chip 20 in FIG. 3 may be connected and aligned in such a way that the memory redistribution structure 350 faces the logic redistribution structure 240. Through the memory redistribution structure 350 and the logic redistribution structure 240, some of the TMV contacts 335 of the memory chip 30 may be connected to some of the first TSV contacts 235 of the logic chip 20. To interconnect the memory chip 30 in FIG. 5 with the logic chip 20 in FIG. 3, the memory redistribution lines 354 may be interconnected with the contact terminals 248 (e.g., see FIG. 3) by a thermocompression process and a reflow process.

Figure 6:
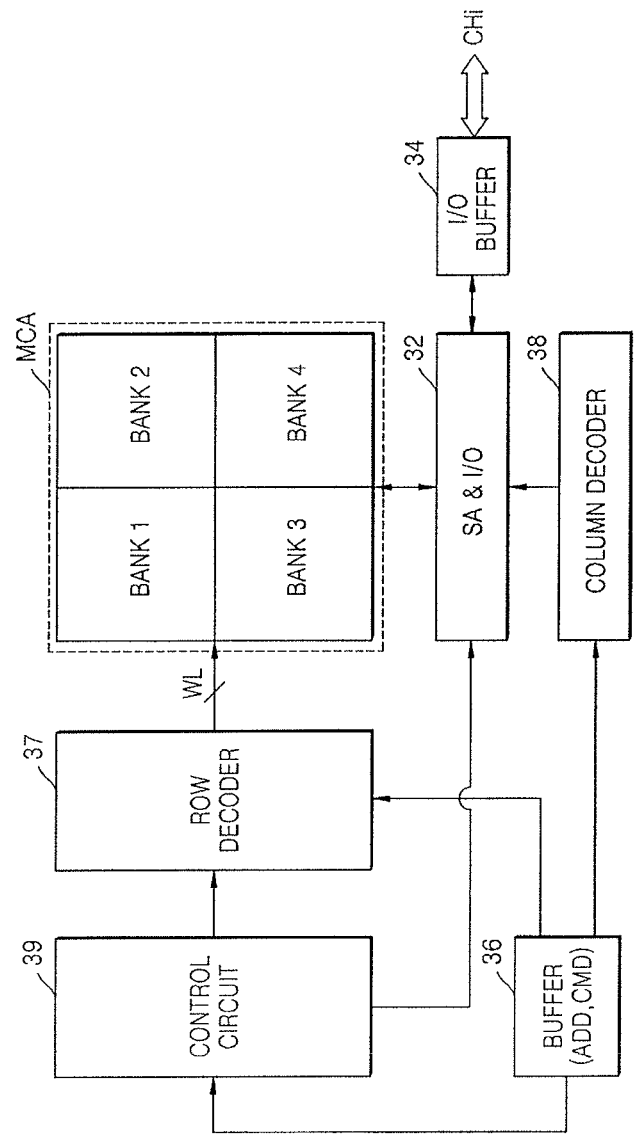
FIG. 6 illustrates an embodiment of a memory chip in an image sensor package.

FIG. 6 illustrates an embodiment of the memory chip 30 in FIG. 5. In this embodiment, the memory chip 30 is a DRAM. Referring to FIG. 6, the memory chip 30 may include a memory cell array MCA, a sense amplifier and I/O circuit 32, an I/O buffer 34, a buffer 36, a row decoder 37, a column decoder 38, and a control circuit 39.

The memory cell array MCA may include a plurality of memory cells including a single access transistor and a single capacitor. The memory cells may be aligned in a matrix shape including columns and rows. In FIG. 6, the memory cell array MCA may be divided, for example, into BANK 1, BANK 2, BANK 3, and BANK 4. The memory cell array MCA may have a different structure and/or number of banks in another embodiment.

The control circuit 39 may receive applied control signals and addresses and generate an internal control signal for controlling set operation modes. The buffer 36 may receive an applied address and perform buffering. Based on the internal control signal transmitted by the control circuit 39, the buffer 36 may provide a row address for selecting the row of a memory cell array MCA to a row decoder 37 and a column address for selecting a column of the memory cell array MCA to a column decoder 38. The buffer 36 may receive an applied command and perform buffering. The command may be applied to the control circuit 39 and decoded. Based on an internal control signal transmitted by the control circuit 39, the row decoder 37 decodes the row address.

When the decoding result of the row address is applied to the memory cell array MCA, only selected word lines may be driven from among a plurality of word lines connected to memory cells. The column decoder 38 decodes a column address based on the internal control signal. Column gating may be performed based on the decoded column address. As a result of column gating, only selected bit lines may be driven from among bit lines connected to memory cells. The sense amplifier and I/O circuit 32 may detect a potential of a bit line of a selected memory cell and sense data stored in the selected memory cell. The I/O buffer 34 may buffer input/output data. In a read operation mode, the I/O buffer 34 may buffer data that has been read out by the sense amplifier and I/O circuit 32 and output data to a channel CHi.

Figure 7:
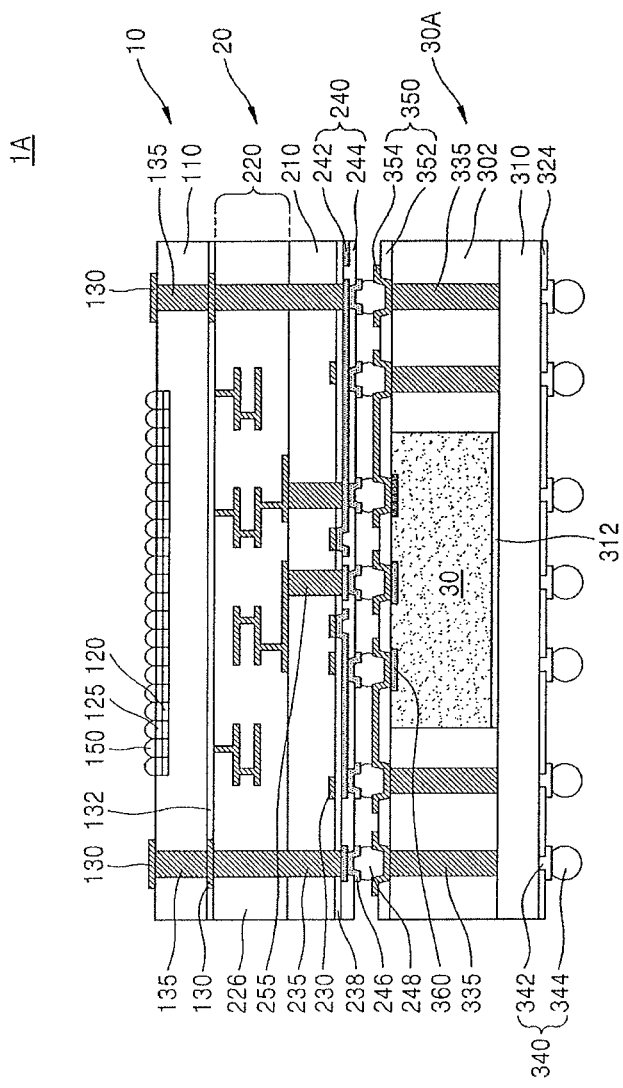
FIG. 7 illustrates an embodiment of an image sensor package including an image sensor chip, a logic chip, and a memory chip.

FIG. 7 illustrates a cross-sectional view of an embodiment of an image sensor package 1A including the image sensor chip 10 in FIG. 2B, the logic chip 20 in FIG. 3, and the memory chip 30 in FIG. 5, which are mounted as a single package.

Referring to FIG. 7, the memory chip 30, the logic chip 20, and the image sensor chip 10 vertically overlap each other in this order in the image sensor package 1A. The width of the memory chip 30 may be less than that of the logic chip 20 and may be less than that of the image sensor chip 10. In some embodiments, the logic chip 20 and the image sensor chip 10 may have a substantially identical width.

Figure 8:
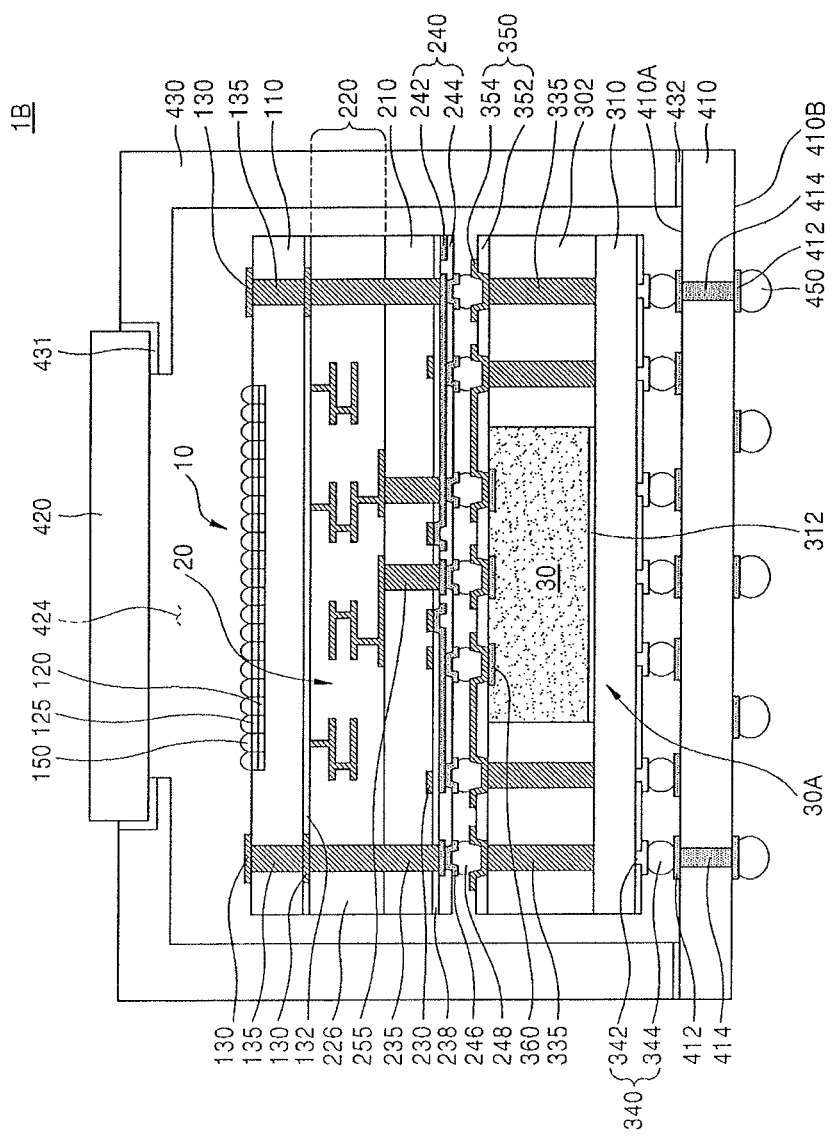
FIG. 8 illustrates another embodiment of an image sensor package including an image sensor chip, a logic chip, and a memory chip.

FIG. 8 illustrates a cross-sectional view of an embodiment of an image sensor package 1B including the image sensor chip 10 in FIG. 2B, the logic chip 20 in FIG. 3, and the memory chip 30 in FIG. 5, which are mounted as a single package.

Referring to FIG. 8, the image sensor package 1B includes a package substrate 410. The memory chip 30, the logic chip 20, and the image sensor chip 10 are sequentially stacked on the package substrate 410 in this order. The memory chip 30, the logic chip 20, and the image sensor chip 10 may overlap one another in a direction being perpendicular to a direction in which the package substrate 410 extends.

The logic redistribution lines 242 of the logic redistribution structure 240 may extend in parallel to the memory redistribution lines 354 of the memory redistribution structure 350, while being spaced apart from each other.

The first TSV contacts 235 passing through the logic chip 20 may be connected to an internal circuit of the logic chip 20, via at least one of the logic redistribution lines 242 of the logic redistribution structure 240 or the memory redistribution lines 354 of the memory redistribution structure 350. In some embodiments, the first TSV contacts 235 passing through the logic chip 20 may be connected to an internal circuit of the memory chip 30, via at least one of the logic redistribution lines 242 of the logic redistribution structure 240 or the memory redistribution lines 354 of the memory redistribution structure 350.

The contact terminals 248 are between the logic chip 20 and the memory chip 30. The contact terminals 248 may include at least one contact terminal 248, that directly connects the logic chip 20 to the memory chip 30 without the first TSV contacts 235, and at least one contact terminal 248, between the logic chip 20 and the molding portion 302, to connect the first TSV contacts 235 to the TMV contact 335.

The molding portion 302 surrounding the memory chip 30 is between the package substrate 410 and the logic chip 20. The TMV contacts 335 vertically extend through the molding portion 302. At least one of the TMV contacts 335 may be connected to at least one of the memory chip 30 or the logic chip 20 through at least one of the memory redistribution structure 350 or the logic redistribution structure 240.

The memory chip 30, the logic chip 20, and the image sensor chip 10 are surrounded by a holder 430 supporting a transparent cover 420 on the package substrate 410. The holder 430 may be in an edge region of the package substrate 410. A transparent cover 420 may include a transparent material (e.g., glass) that allows light to pass therethrough. The transparent cover 420 may face the microlenses 150 in the image sensor chip 10 on the image sensor chip 10. A light-receiving space 424 may be between the image sensor chip 10 and the transparent cover 420. The transparent cover 420 may be fixed on a holder 430 by a first adhesive layer 431. The holder 430 may be fixed on the package substrate 410 by a second adhesive layer 432.

The package substrate 410 may be a printed circuit board (PCB) having a circuit pattern. The package substrate 410 may include a plurality of contact pads 412 and a plurality of through vias 414. The contact pads 412 may be exposed by a top surface 410A of the package substrate 410 facing the memory chip 30 and a bottom surface 410B thereof opposite to the top surface 410A. The through vias 414 pass through the package substrate 410 and may be electrically connected to the contact pads 412.

The bump 344 may be connected to each of the contact pads 412 exposed by the top surface 410A of the package substrate 410. A plurality of contact terminals 450 may be connected to the contact pads 412 exposed by the bottom surface 410B of the package substrate 410. For example, the contact pads 412 may include Al or Cu, the contact terminals 450 may include Cu, Al, Au, solder, or the like, and the through vias 414 may include a conductive material, for example, Cu or W.

Each of the first adhesive layer 431 and the second adhesive layer 432 may include a curable polymer. In one embodiment, each of the first adhesive layer 431 and the second adhesive layer 432 may include an epoxy polymer.

In some embodiments, the internal space surrounded by the transparent cover 420, the holder 430, the first adhesive layer 431, and the second adhesive layer 432 on the package substrate 410 may maintain its sealing state. Out of the internal space, a portion excluding the light-receiving space 424 may be filled with a mold layer. The mold layer may include an under fill layer filling the memory chip 30 and the logic chip 20. The under fill layer may be formed by a capillary underfill method.

The transmission path of power voltage and ground voltage, which are externally provided, and the transmission path of signals in the image sensor packages 1A and 1B in FIGS. 7 and 8 will be described in detail.

The power voltage, ground voltage, or signals, which are externally provided to the image sensor packages 1A and 1B, may be first provided to the interconnection structure of the image sensor chip 10. In some embodiments, the power voltage, ground voltage, or signals may be provided to the logic chip 20 via at least one of the TSV contacts 135 in the image sensor chip 10.

In some embodiments, the power voltage, ground voltage, or signals may be provided to the logic chip 20, for example, an internal circuit of the logic chip 20 sequentially provided via at least one of the TSV contacts 135 included in the image sensor chip 10, at least one of the first TSV contacts 235 passing through the logic chip 20, and at least one of the logic redistribution line 242 and the memory redistribution line 354 between the logic chip 20 and the memory chip 30, in this stated order, and then via the second TSV contacts 255.

In some embodiments, the power voltage, ground voltage, and signals may be provided to the memory chip 30, for example, an internal circuit of the memory chip 30. The power voltage, ground voltage, or signals may be sequentially provided via at least one of the TSV contacts 135 in the image sensor chip 10, at least one of the first TSV contacts 235 passing through the logic chip 20, and at least one of the logic redistribution line 242 and the memory redistribution line 354 between the logic chip 20 and the memory chip 30, in this order.

In some embodiments, the power voltage and ground voltage and signals may be provided to the package substrate 410 sequentially via at least one of the TSV contacts 135 of the image sensor chip 10, at least one of the first TSV contacts 235 passing through the logic chip 20, and the TMV contacts 335 passing through the molding portion 302 surrounding the memory chip 30.

Unlike the image sensor packages 1, 1A, and 1B, when a wire bonding method is used to provide power voltage and ground voltage and signals from the image sensor chip 10 to the package substrate 410, a signal transmission path may be lengthened and an interconnection resistance increases and inductance increases. This may cause an IR drop to occur, which leads to a smaller interconnection space between chips and poorer power integrity (PI) characteristics.

However, in the case of the image sensor packages 1, 1A, and 1B according to one or more embodiments, power voltage and ground voltage and signals may be provided to the package substrate 410 via a relatively short path, that is, via the first TSV contacts 235 passing through the logic chip 20 and the TMV contacts 335 passing through the molding portion 302 surrounding the memory chip 30. Accordingly, the image sensor packages 1, 1A, and 1B having a multi-level stack structure, in which chips having various functions for taking high-speed moving pictures, are vertically stacked may retain optimized PI characteristics.

Figure 9A:
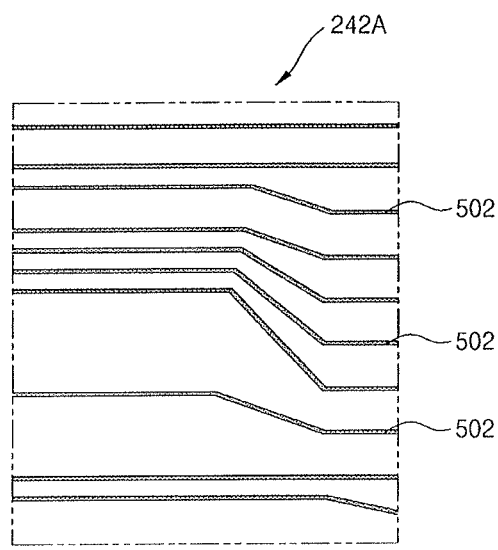
FIGS. 9A and 9B illustrate an embodiment of redistribution lines of an image sensor package.
Figure 9B:
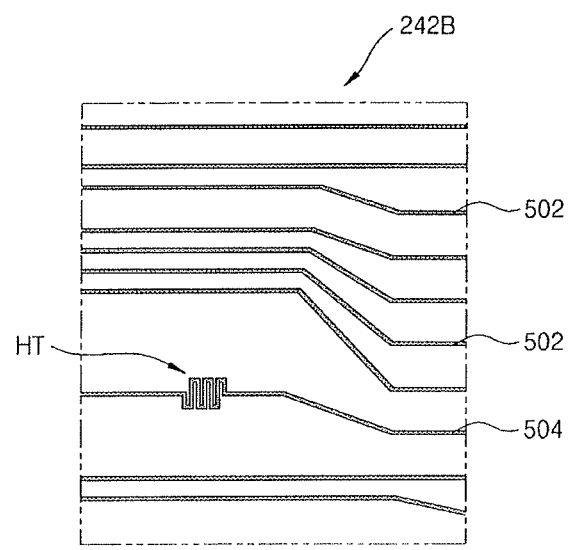

FIGS. 9A and 9B illustrates an embodiment for explaining example constituents of a plurality of redistribution lines in a redistribution structure of an image sensor package. FIGS. 9A and 9B illustrate example constituents of the redistribution lines 242A and 242B of at least some of the logic redistribution lines 242 in the logic redistribution structure 240 of the logic chip 20.

Referring to FIG. 9A, a plurality of redistribution lines 242A may extend in various directions according to a design. Each of the redistribution lines 242A may include a plurality of conductive lines 502 connected to at least some of internal circuits of the logic chip 20.

Referring to FIG. 9B, the redistribution lines 242B includes a plurality of conductive lines 502 connected to at least some internal circuits of the logic chip 20, and at least one heater line 504 that is not connected to an internal circuit of the logic chip 20. The at least one heater line 504 includes a heater portion HT locally generating heat based on the application of power. FIG. 9B illustrates only one heater line 504 including the heater portion HT. A plurality of heater lines 504 may be included in another embodiment, where each of the heater lines 504 includes the heater portion HT.

The redistribution lines 242A in FIG. 9A may not include the heater line 504 including the heater portion HT in FIG. 9B.

Referring to FIGS. 9A and 9B, each of the conductive lines 502 and at least one heater line 504 may include metal, metal nitride, or a combination thereof. For example, each of the conductive lines 502 and at least one heater line 504 may include W, Cu, Zr, Ti, Ta, Al, Ru, Pd, Pt, Co, Ni, a nitride thereof, or a combination thereof. In FIG. 9B, the conductive lines 502 and at least one heater line 504 may include the same material.

FIG. 9B illustrates one heater line 504. However, the logic chip 20 of an image sensor package may include a plurality of heater lines 504. For example, in the image sensor package 1A in FIG. 7, when a light-receiving portion of the image sensor 100 (e.g., see FIG. 2B) in the image sensor chip 10 has a non-uniform temperature, a pixel array of the image sensor 100 may have a non-uniform temperature distribution. This may cause a difference in outputs of a plurality of sensors, each including a plurality of pixels which form a pixel array.

In this case, even when photographing is performed in a dark chamber where light does not exist, the difference in dark current, which may occur locally, may result in dark shading. The dark shading may occur due to the temperature deviation in the pixel array. Because the heat distribution in the image sensor 100 is not uniform due to inclusion of, from among various IPs in the logic chip 20, a high power-consuming IP, for example, a PLL IP.

The logic chip 20 of an image sensor package according to one or more embodiments may include, as in FIG. 9B, at least one heater line 504 including the heater portion HT in the redistribution lines 242B. In this case, by locating the heater portion HT in a portion that does not vertically overlap the high-power consuming IP (e.g., a spot of the light-receiving portion of the image sensor 100 (see FIG. 2B), of which temperature is relatively low) or a portion near the spot, heat is only applied to a portion of the pixel array in the light-receiving portion of the image sensor 100.

FIGS. 9A and 9B illustrate an example structure of the redistribution lines 242A and 242B available as the logic redistribution lines 242 in the logic redistribution structure 240 of the logic chip 20. However, in another embodiment of an image sensor package, the redistribution lines 242A and 242B in FIGS. 9A and 9B may be used as the memory redistribution lines 354 in the memory redistribution structure 350 of the memory chip 30. For example, the memory redistribution structure 350 of the memory chip structure 30A of the image sensor chip 1A in FIG. 7 may include, as explained in connection with FIG. 9A, the redistribution lines 242A including the conductive lines 502, or as explained in connection with FIG. 9B the redistribution lines 242B including the conductive lines 502 and at least one heater line 504 including the heater portion HT.

In some embodiments, at least one redistribution structure of the logic redistribution structure 240 of the logic chip 20 and the memory redistribution structure 350 of the memory chip structure 30A may include at least one heater line 504 including the heater portion HT in FIG. 9B. In this regard, the heater line 504 may not be connected to an internal circuit of the logic chip 20 and an internal circuit of the memory chip 30.

Figure 10:
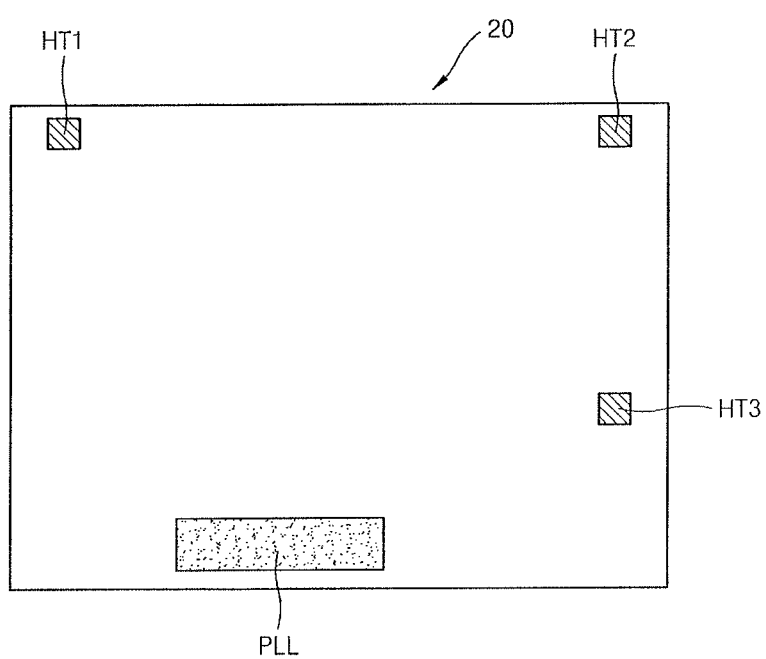
FIG. 10 illustrates an embodiment of an image sensor package and an example location of IP in a logic chip and a heater in an image sensor package.

FIG. 10 illustrates an embodiment of an image sensor package, and a relative example location of IP that has relatively high power consumption in a logic chip and a heater in an image sensor package. FIG. 10 will be used to explain an phase-locked loop (PLL) of the logic chip 20 as an example of a high-power consuming IP, and a plurality of heater portions HT1, HT2, and HT3 corresponding to the heater portion HT in the heater line 504 in FIG. 9B.

Referring to FIG. 10, the logic chip 20 includes at least one PLL. Accordingly, a light-receiving portion of the image sensor 100 in the image sensor chip 10 may have a non-uniform temperature distribution. However, formation of the redistribution line 242B including at least one heater portion HT (e.g., three heater portions HT1, HT2, and HT3), located at least one spot of a planar region of the logic chip 20 spaced apart from at least one PLL, may contribute to a uniform temperature-distribution of the light-receiving portion of the image sensor 100.

In some embodiments, the redistribution line 242B of the logic chip 20 includes a plurality of heater portions HT (e.g., heater portions HT1, HT2, and HT3 in FIG. 10). The same intensity of power may be applied to the heater portions HT. In some embodiments, different intensities of power may be applied to at least some of the heater portions HT in the redistribution line 242B of the logic chip 20.

For example, the intensity of power applied to each of the heater portions HT of the redistribution line 242B of the logic chip 20 may be independently controlled. To control the temperature distribution in the light-receiving portion of the image sensor 100 to be uniform, the intensity of power applied to the heater portions HT may be individually controlled. For example, to control the temperature distribution in the light-receiving portion of the image sensor 100 to be uniform, different intensities of power may be applied to the heater portions HT1, HT2, and HT3 in FIG. 10 so that the heater portions HT1, HT2, and HT3 provide different heating values. The power intensity may be, for example, the range of about 5 mW to about 100 mW.

As described above, the heater portions HT (e.g., three heater portions HT1, HT2, and HT3 in FIG. 10 in the redistribution line 242B) may generate heat in only a portion of the logic chip 20. As a result, the light-receiving portion of the image sensor 100 may have a uniform temperature distribution.

FIG. 9B illustrates an embodiment of a heater element having a serpentine-shaped conductive line as an example of the heater portion HT on the plane of the logic chip 20. The heater portion HT may have a different shape in another embodiment. Each of the heater portion HT in FIG. 9B and the heater portions HT1, HT2, and HT3 in FIG. 10 may be a heater element having various shapes. For example, each of the heater elements of the heater portions HT, HT1, HT2, and HT3 may be a conductive line having a square shape, a concentric ring shape, or another shape, extending on a plane.

The heater elements of the heater portions HT, HT1, HT2, and HT3 may receive a direct current (DC) current via a power supply line and a power return line to which the heater elements are connected. The DC current may be provided to the heater portions HT, HT1, HT2, and HT3 via the power supply line and may flow back via the power return line. The power supply line and the power return line, through which the DC current is provided to the heater elements, may not be connected to an internal circuit of the logic chip 20 and an internal circuit of the memory chip 30.

In some embodiments, each of the power supply line and the power return line may include the same material used to form the conductive lines 502 of the redistribution lines 242A in FIG. 9B. In some embodiments, each of the heater line 504 and the heater portion HT may include a material having low resistivity, such as Cu, Al, W, Mo, or the like.

The heater line 504 and the heater portion HT in FIG. 9B may only provide heat to a portion of the planar region of the logic chip 20. For example, heat provided by the heater portion HT may be transferred to a first portion of the planar region of the logic chip 20 and a portion of the image sensor chip 10 that vertically overlaps the first portion. The heat provided by the heater portion HT may not be provided to a second portion of the planar region of the logic chip 20. The second portion may be different from the first portion and a portion of the image sensor chip 10 that vertically overlaps the second region. In some embodiments, a limited intensity of power may be provided to the heater portion HT so that heat provided by the heater portion HT is not transferred to a portion of the planar region of the logic chip 20 where a high-power consuming IP (e.g., PLL) is located, and a portion of the image sensor chip 10 that vertically overlaps the PLL.

In an image sensor package according to one or more embodiments, because the heater line 504 including the heater portion HT in FIG. 9B is included, heat is locally provided to a portion of the light-receiving portion of the image sensor chip 10 having a relatively low temperature. Thus, the temperature distribution of the image sensor 100 is therefore unified and quality of an image produced by the image sensor package is improved.

Figure 11:
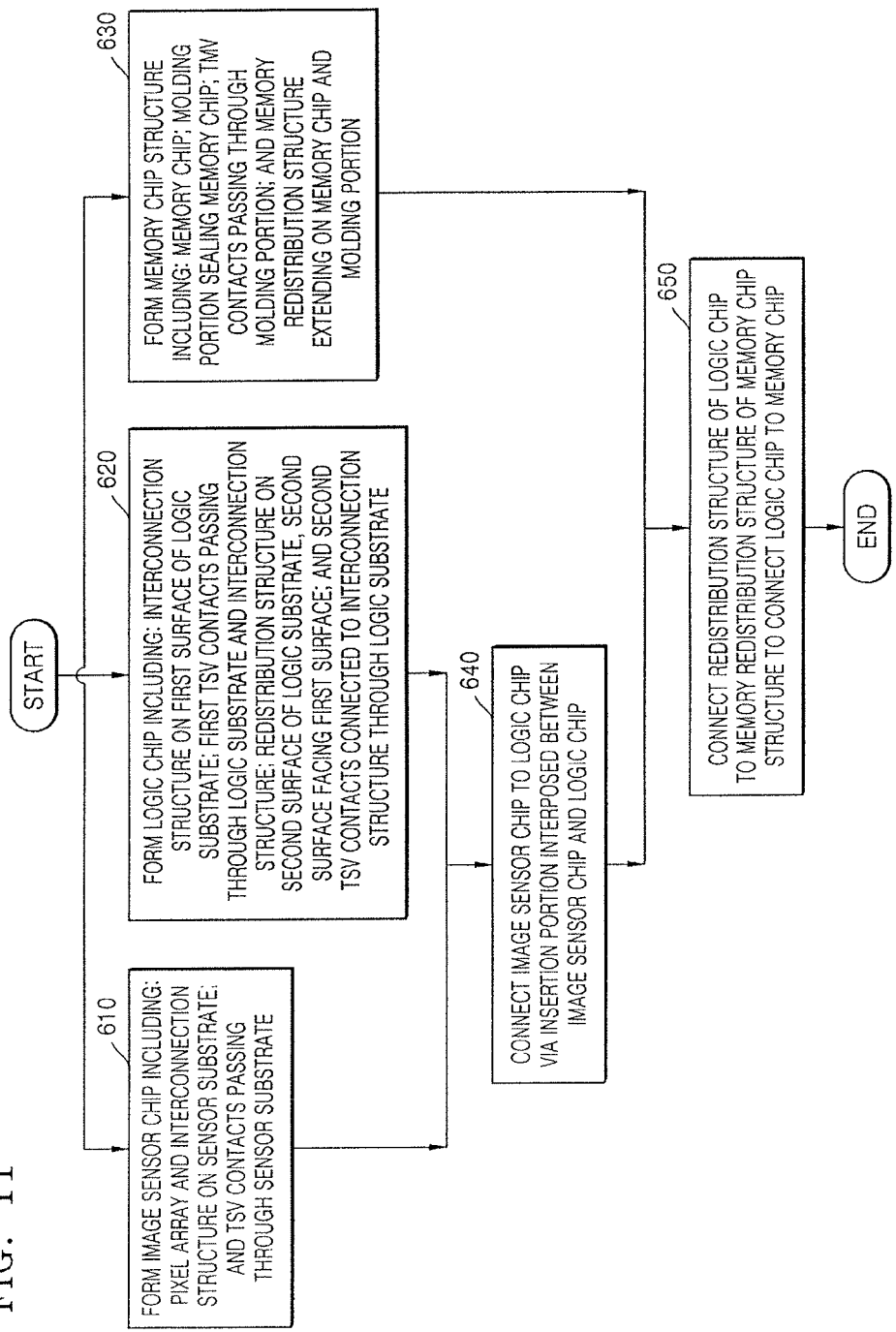
FIG. 11 illustrates an embodiment of a method for manufacturing an image sensor package.

FIG. 11 illustrates an embodiment of a method for manufacturing an image sensor package, e.g., the image sensor package in FIG. 7. Referring to FIG. 11, in process P610, the image sensor chip 10 in FIGS. 2A and 2B is formed. The image sensor chip 10 includes a pixel array having a plurality of unit pixels, an interconnection structure on the sensor substrate 110, and the TSV contacts 135 passing through the sensor substrate 110.

In process P620, the logic chip 20 in FIG. 3 is formed. The logic chip 20 includes the interconnection structure 220 on the first surface of the logic substrate 210, the first TSV contacts 235 passing through the logic substrate 210 and interconnection structure 220, the logic redistribution structure 240 on the second surface of the logic substrate 210, the second surface opposite to the first surface, and the second TSV contacts 255 connected to the interconnection structure 220 through logic substrate 210.

In process P630, the memory chip structure 30A in FIG. 5 is formed by a chip-on-wafer (COW) bonding method. The memory chip structure 30A includes the memory chip 30 attached to the lower structure 310 and the molding portion 302 sealing the memory chip 30 on the lower structure 310. The TMV contacts 335 passes through the molding portion 302. The memory redistribution structure 350 is on the memory chip 30 and the molding portion 302.

In process P640, as illustrated in FIG. 4A, the image sensor chip 10 and the logic chip 20 are connected to each other with the insertion portion 28 therebetween.

In process P650, as illustrated in FIG. 7, the logic redistribution structure 240 of the logic chip 20 is connected to the memory redistribution structure 350 of the memory chip structure 30A using the contact terminals 248, thereby connecting the logic chip 20 to the memory chip 30.

A method for fabricating an image sensor package may be different from the embodiment in FIG. 11 in various ways. For example, the sequence of processes P610, P620, and P630 may be different in another embodiment and/or may be changed. In some embodiments, the sequence of process P640 and process P650 is not limited to the sequence that has been explained in connection with FIG. 11 and may be changed.

To fabricate the image sensor package 1B in FIG. 8, the processes P610 to P650 explained in connection with FIG. 11 may be performed in a different sequence. In some embodiments, the memory chip structure 30A obtained by process P630 may be mounted on the package substrate 410. Thereafter, as illustrated in FIG. 8, the transparent cover 420 and the holder 430 supporting the transparent cover 420 may be mounted on the package substrate 410 using the first adhesive layer 431 and the second adhesive layer 432. A process may be performed to form a mold layer to fill a portion of the internal space, surrounded by the transparent cover 420, the holder 430, the first adhesive layer 431, and the second adhesive layer 432 on the package substrate 410, other than the light-receiving space 424.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The processors, controllers, control circuits, comparators, drivers, counters, and other signal generating and signal processing circuits may be implemented in logic which, for example, may include hardware, software, or both. When implemented at least partially in hardware, the processors, controllers, control circuits, comparators, drivers, counters, and other signal generating and signal processing circuits may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, controllers, control circuits, comparators, drivers, counters, and other signal generating and signal processing circuits may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

An image sensor package fabricated using the method of the present embodiments may provide power voltage and ground voltage and signals to the package substrate 410 in a short or shortest pathway, e.g., via the first TSV contacts 235 passing through the logic chip 20 and then the TMV contacts 335 passing through the molding portion 302 surrounding the memory chip 30. Accordingly, image sensor packages having a multi-level stack structure (in which chips having various functions for taking high-speed moving pictures are vertically stacked) may retain optimized PI characteristics.

In accordance with one or more embodiments, a power voltage and ground voltage and/or signals may be provided to a package substrate via a relatively short path, e.g., via a first TSV contact passing through the logic chip and a TMV contact passing through a molding portion surrounding the memory chip. Accordingly, image sensor packages having a multi-level stack structure (in which chips having various functions for taking high-speed moving pictures are vertically stacked) may retain optimized PI characteristics. In accordance with one or more embodiments, a light-receiving portion of an image sensor may achieve a uniform temperature distribution, which, in turn, may lead to a higher quality of an image obtained by the image sensor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A package, comprising:
a first chip having an interconnection structure to which signals are provided;
a second chip vertically overlapping the first chip, the second chip to process the signals transmitted by the first chip, the second chip configured to generate a signal information by processing at least one of signals received from the first chip;
a third chip vertically overlapping the first and second chips, the second chip being interposed between the first chip and the third chip, the third chip configured to store the signal information received from the second chip;
a conductive pad directly between a bottom surface of the first chip and a top surface of the second chip, the conductive pad electrically connecting the first chip and the second chip; and
at least one redistribution structure interposed between the second chip and the third chip, the at least one redistribution structure having at least one redistribution line through which the second chip and the third chip are connected, and at least a portion of the at least one redistribution line extending to directly contact a top surface of the third chip.

2. The package as claimed in claim 1, further comprising:
a molding portion surrounding the third chip; and
at least one through mold via (TMV) contact vertically passing through an entire thickness of the molding portion and connected to at least one of the second chip and the third chip through the at least one redistribution structure.

3. The package as claimed in claim 1, wherein the second chip is to receive a power voltage or a ground voltage via the first chip and the at least one redistribution structure.

4. The package as claimed in claim 1, wherein:
the first chip includes a first through silicon via (TSV) contact, and
the second chip includes:
a substrate;
an interconnection structure on the substrate; and
a second TSV contact passing through the substrate and the interconnection structure, the conductive pad directly connecting between the second TSV contact and the first TSV contact, the first TSV contact, the second TSV contact, and the conductive pad being aligned with each other.

5. The package as claimed in claim 1, wherein the second chip includes a substrate, an interconnection structure on the substrate, and a TSV contact passing through the substrate, the TSV contact having a first end connected to an interconnection layer in the interconnection structure and a second end connected to the third chip through the at least one redistribution structure.

6. The package as claimed in claim 1, wherein the at least one redistribution structure includes:
a first redistribution structure on a surface of the second chip facing the third chip, the first redistribution structure including a plurality of first redistribution lines connected to an interconnection structure in the second chip; and
a second redistribution structure on a surface of the third chip facing the second chip, and connected to the third chip, the second redistribution structure being connected to the first redistribution structure through contact terminals,
wherein the first and second redistribution structures are vertically spaced apart from each other to include an empty space therebetween.

7. The package as claimed in claim 1, wherein the at least one redistribution structure includes:
a conductive line connected to an internal circuit of at least one of the second chip or the third chip; and
at least one heater portion to provide heat to a portion of the first chip.

8. The package as claimed in claim 1, further comprising:
a molding portion surrounding sidewalls of the third chip; and
at least one TMV contact vertically passing through the molding portion and connected to at least one of the second chip and the third chip through the at least one redistribution structure,
wherein the at least one redistribution structure includes redistribution lines extending between the second chip and the third chip and between the molding portion and the second chip, the redistribution lines being connected to an interconnection structure within the third chip, portions of the redistribution lines extending to directly contact the top surface of the third chip and a top surface of the at least one TMV contact.

9. A package, comprising:
an image sensor chip having an interconnection structure to which signals are provided;
a logic chip vertically overlapping the image sensor chip, the logic chip to process a pixel signal output by the image sensor chip, the logic chip configured to generate a signal information by processing at least one of signals received from the image sensor chip; and
a memory chip vertically overlapping the image sensor chip and the logic chip, the logic chip being interposed between the image sensor chip and the memory chip, the memory chip configured to store the signal information received from the logic chip, wherein the image sensor chip and the logic chip are directly connected to each other via a conductive pad, and wherein the logic chip and the memory chip are connected via at least one redistribution structure having a plurality of redistribution lines, at least a portion of the plurality of redistribution lines extending to directly contact a top surface of the memory chip.

10. The package as claimed in claim 9, wherein no TSV contact is connected between the logic chip and the memory chip.

11. The package as claimed in claim 9, further comprising:
   a molding portion surrounding a perimeter of the memory chip; and
   at least one TMV contact vertically passing through an entire thickness of the molding portion and connected to at least one of the logic chip and the memory chip through the at least one redistribution structure.

12. The package as claimed in claim 9, further comprising:
   a molding portion surrounding a perimeter of the memory chip;
   a TMV contact vertically passing through the molding portion, top surfaces of the TMV contact and the memory chip being coplanar; and
   a TSV contact vertically passing through the logic chip, the TSV contact being vertically aligned with the TMV contact.

13. The package as claimed in claim 9, further comprising:
   a molding portion surrounding sidewalls of the memory chip;
   a TMV contact vertically passing through the molding portion; and
   a first TSV contact vertically passing through the image sensor chip, the first TSV contact being vertically aligned with the TMV contact.

14. The package as claimed in claim 13, further comprising a second TSV contact passing through the logic chip, wherein the TMV contact, the first TSV contact, the conductive pad, and the second TSV contact are centered and vertically aligned with one another.

15. The package as claimed in claim 9, wherein the at least one redistribution structure includes:
   a first redistribution structure on a surface of the logic chip facing the memory chip, the first redistribution structure including a plurality of first redistribution lines connected to an interconnection structure in the logic chip; and
   a second redistribution structure on a surface of the memory chip facing the logic chip, and connected to the memory chip, the second redistribution structure being connected to the first redistribution structure through contact terminals.

16. A package, comprising:
   a memory chip structure mounted on a package substrate, the memory chip structure including:
      a memory chip on the package substrate,
      a molding portion on the package substrate and surrounding a perimeter of the memory chip, and
      at least one TMV contact vertically passing through the molding portion, top surfaces of the at least one TMV contact and the memory chip being coplanar;
   an image sensor chip including a pixel array, an interconnection structure, and at least one first TSV contact;
   a logic chip interposed between the memory chip structure and the image sensor chip, the logic chip including at least one second TSV contact; and
   a conductive pad directly connecting the least one first TSV contact and the at least one second TSV contact to each other,
   wherein the at least one TMV contact is vertically aligned with the at least one second TSV contact.

17. The package as claimed in claim 16, wherein the at least one TMV contact, the at least one first TSV contact, and the at least one second TSV contact are vertically aligned with one another.

18. The package as claimed in claim 16, further comprising:
   at least one redistribution structure interposed between the memory chip structure and logic chip, wherein the logic chip is to receive one or more signals via the image sensor chip and the at least one redistribution structure.

19. The package as claimed in claim 16, wherein:
   the memory chip structure includes a memory redistribution structure extending between the memory chip and the logic chip and between the molding portion and the logic chip, the memory redistribution structure connected to an interconnection structure within the memory chip, and
   the memory redistribution structure includes an insulating layer covering the memory chip and the molding portion, and a plurality of memory redistribution lines on the insulating layer, portions of the plurality of memory redistribution lines extending through the insulating layer to contact a top surface of the memory chip and a top surface of the at least one TMV contact.

20. The package as claimed in claim 16, wherein no TSV contact is connected between the logic chip and the memory chip.

* * * * *